United States Patent [19]

Beasley et al.

[11] Patent Number: 5,483,170

[45] Date of Patent: Jan. 9, 1996

[54] INTEGRATED CIRCUIT FAULT TESTING IMPLEMENTING VOLTAGE SUPPLY RAIL PULSING AND CORRESPONDING INSTANTANEOUS CURRENT RESPONSE ANALYSIS

[75] Inventors: Jeffrey S. Beasley, Las Cruces, N.M.; Hema Ramamurthy, Austin, Tex.; Jaime Ramirez-Angulo; Mark R. DeYong, both of Las Cruces, N.M.

[73] Assignee: New Mexico State University Technology Transfer Corp., Las Cruces, N.M.

[21] Appl. No.: 110,868

[22] Filed: Aug. 24, 1993

[51] Int. Cl.$^6$ .................................................. G01R 31/00
[52] U.S. Cl. ........................... 324/537; 324/522; 324/765; 371/25.1
[58] Field of Search .......................... 324/537, 522, 324/523, 713, 719, 763, 158.1, 710, 712, 765, 771; 371/22.5, 25.1, 27, 22.6

[56] References Cited

U.S. PATENT DOCUMENTS

| | | | |
|---|---|---|---|
| 3,803,484 | 4/1974 | Gray | 324/54 |
| 4,630,228 | 12/1986 | Tarczy-Hornoch et al. | 364/576 |
| 4,631,724 | 12/1986 | Shimizu | 371/21 |
| 4,710,704 | 12/1987 | Ando | 324/73 R |
| 4,820,974 | 4/1989 | Katsura et al. | 324/73 R |
| 4,965,512 | 10/1990 | DeBar et al. | 324/537 |
| 5,025,344 | 6/1991 | Maly et al. | 324/73.1 |
| 5,049,815 | 9/1991 | Kliman | 324/158 MG |
| 5,057,774 | 10/1991 | Verhelst et al. | 324/158 R |
| 5,097,206 | 3/1992 | Perner | 324/158 R |
| 5,155,701 | 10/1992 | Komori et al. | 365/182 |
| 5,321,354 | 6/1994 | Ooshima et al. | 324/158 R |
| 5,332,973 | 7/1994 | Brown et al. | 324/537 |

OTHER PUBLICATIONS

J. Frenzel, et al., "Power Supply Current Signature (PSCS) Analysis: A New Approach To System Testing," 1987 *International Test Conference*, CH2347–2/87, pp. 125–135 (1987) (Month Unavailable).

M. Hashizume, et al., "Fault Detection of Combinational Circuits Based on Supply Current," 1988 *International Test Conference*, CH2610–4/88, pp. 374–380 (1988)(Month Unavailable).

Primary Examiner—Kenneth A. Wieder
Assistant Examiner—Christopher M. Tobin
Attorney, Agent, or Firm—Jeffrey D. Myers; Donovan F. Duggan; Deborah A. Peacock

[57] ABSTRACT

A method and apparatus for detecting faults in digital, analog, and hybrid integrated circuits is disclosed. A single test vector employing bias voltage on input used in conjunction with pulsing the power supply rails is used to allow detection of the various faults which may be present. The instantaneous rail current ($i_{DD}$) is then employed for analysis of the circuit, preferably by neural network.

16 Claims, 10 Drawing Sheets

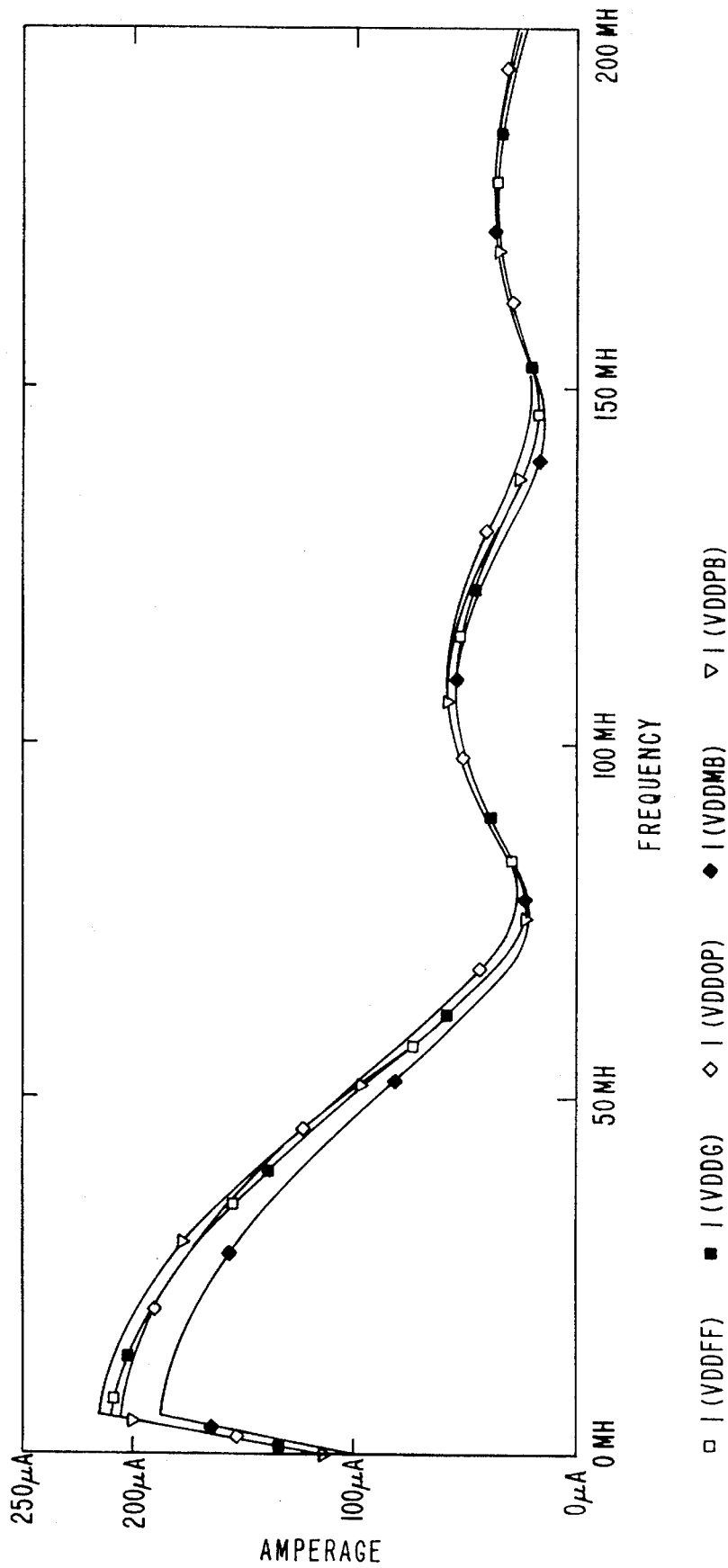

INTEGRATED CIRCUIT FAULT TESTING IMPLEMENTING VOLTAGE SUPPLY RAIL PULSING AND CORRESPONDING INSTANTANEOUS CURRENT RESPONSE ANALYSIS

BACKGROUND OF THE INVENTION

1. Field of the Invention (Technical Field)

The present invention relates to methods of fault testing analog, digital, and hybrid integrated circuits, and apparatuses therefor.

2. Background Art

The complexity of integrated circuit testing is rapidly increasing due to the more prevalent use of mixed-mode (digital-analog) circuits and the smaller feature size of current fabrication processes. It is becoming evident that traditional test techniques are no longer adequate for detecting the presence of faults in these circuits.

The current technique for making fabrication defects observable is through the use of steady-state rail current measurements (IDDQ). This technique allows some reduction of the number of test vectors, but is only appropriate for circuits with zero or very small quiescent currents like CMOS digital circuits and class AB analog circuits.

Hashizume, et al., "Fault Detection of Combinational Circuits Based on Supply Current", 1988 *International Test Conference*, ch. 26104/88, pp. 374–379, addressed the issue of analyzing spectral content of IDD current under normal and faulty operation. Hashizume, et al., did present a method for fault detection based on detecting changes in power supply currents using pattern recognition techniques, but this method requires specific test vectors for making the faults observable.

J. Frenzel and P. Marinos, "Power Supply Current Signature (PSCS) Analysis: A New Approach to System Testing," 1987 *International Test Conference*, ch. 23472/87, pp. 125–135, also discloses a test-vector dependent method. Dorey, et al., *Rapid Reliability Assessment of VLSICs*, New York and London: Plenum Press, 1990, is also test-vector dependent.

U.S. Pat. No. 5,057,774, to Verhelst, et al., entitled "Apparatus for Measuring the Quiescent Current of an Integrated Monolithic Digital Circuit", tests only digital IC's and only measures steady state quiescent current.

U.S. Pat. No. 4,710,704, to Ando, entitled "IC Test Equipment", likewise does not employ instantaneous rail current as a test vector. Similarly for U.S. Pat. No. 4,631,724, to Shimizu, entitled "Semiconductor Memory Test Equipment", which only tests CMOS memory devices.

U.S. Pat. No. 4,630,228, to Tarczy-Hornoch, et al., entitled "Transmission Line Analyzer for Automatically Identifying the Severities and Location of Multiple Mismatches", employs a fast Fourier transform algorithm for analyzing transmission line mismatches—not integrated circuits. Likewise, U.S. Pat. No. 3,803,484, to Gray, entitled "Method and Apparatus for Measuring Deterioration in a Shielded Cable by High Frequency Pulse Injection", detects only cable deterioration.

The prior art lacks a VLSIC (Very Large Scale Integrated Circuit) test method wherein the power supply rails are pulsed while a common DC bias voltage is applied to all inputs. In other words, the prior art lacks a test vector-independent method equally applicable to digital and analog integrated circuits.

SUMMARY OF THE INVENTION
(DISCLOSURE OF THE INVENTION)

The present invention is of a method of, and apparatus for, detecting faults in an integrated circuit, comprising: applying a preselected bias voltage to selected integrated circuit inputs; pulsing the voltage supply rails of the integrated circuit between a preselected minimum and maximum voltage; and analyzing an instantaneous rail current and thereby determining whether defects exist in the integrated circuit. Preferably, a common fixed DC bias voltage is applied to all of the integrated circuit inputs, the voltage supply rails are pulsed at a selected pulse rate with pulses having a designated rise and fall time. The instantaneous rail current is preferably spectrally and temporally analyzed, and differences between signals of defect-free and defective circuits are compared. The current to be analyzed is preferably provided to a current mirror.

The present invention is also of a method of, and apparatus for, detecting faults in an integrated circuit, comprising:

providing a plurality of defect-free and defective integrated circuits; and training a neural network to distinguish the defect-free integrated circuits from the defective integrated circuits by analysis of an output of the circuits. In the preferred embodiment, the output analyzed is a current output.

An object of the invention is the provision of a single test vector method for testing integrated circuits.

Another object of the invention is the provision of controllability and observability while testing integrated circuits.

Yet another object of the invention is the provision of using only instantaneous rail current ($i_{DD}$) to analyze integrated circuit faults.

An advantage of the invention is its applicability to digital, analog and mixed-mode integrated circuits.

Another advantage of the invention is in the ease of integrated circuit fault detection through supply line monitoring only.

Yet another advantage of the invention is its adaptability to neural network automated fault-detection techniques.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIG. 5 is a spectral diagram of the $i_{DD}$ pulse responses for the FIG. 4 circuit;

DESCRIPTION OF THE PREFERRED EMBODIMENTS (BEST MODES FOR CARRYING OUT THE INVENTION)

The present invention is of methods and apparatuses for fault-testing integrated circuits by analyzing spectral and temporal characteristics of the circuits' $i_{DD}$ signal upon pulsing the circuits' voltage supply rails. The invention is also of methods and apparatuses for doing the above analysis automatically by means of a neural network.

Figure 11:
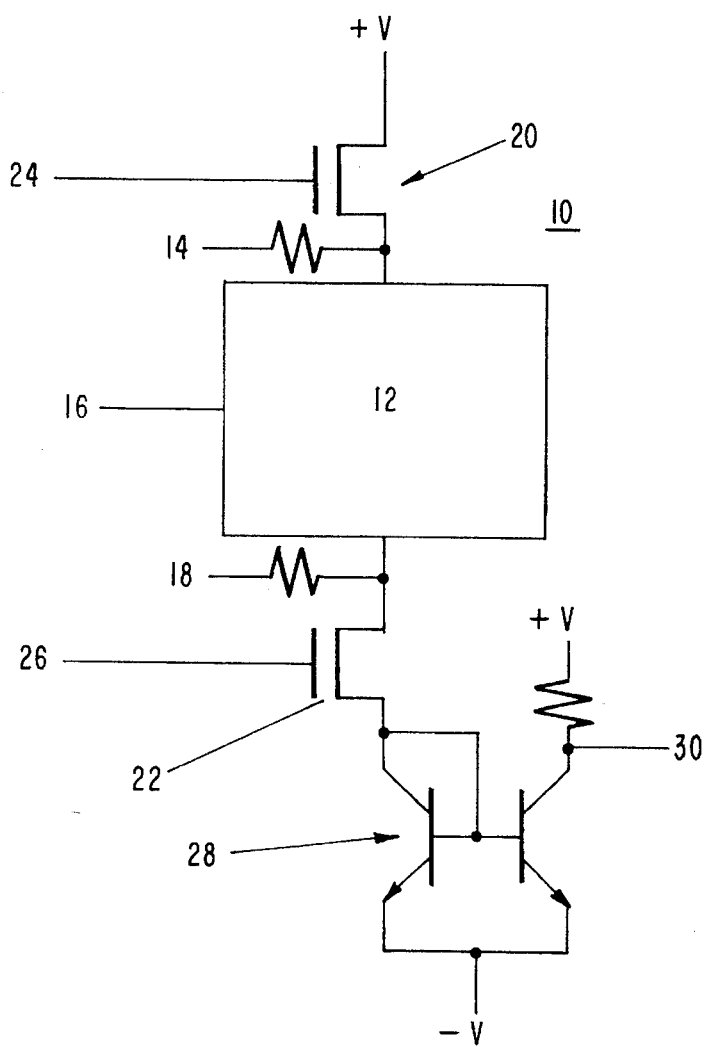
FIG. 11 is a schematic diagram of the preferred testing apparatus of the invention.

The preferred testing apparatus of the invention is depicted in FIG. 11. As shown therein, apparatus 10 comprises integrated circuit 12 to be tested. Pre-bias input voltages are applied at 14, 16 and 18 and comprise a voltage at the midpoint of the $V_{DD}$ and $V_{SS}$ rails ($V_{CC}$ and $V_{EE}$ rails for bipolar devices). The pre-bias voltage will cause the power supply rails of the circuit to be tested to go to the pre-bias voltage level when power MOSFETs 20 and 22 are turned off.

Power MOSFETs 20 and 22 are pulsed by pulse control circuits 24 and 26, respectively, at the desired pulse rate and desired rise and fall times. Power MOSFETs 20 and 22 thus act as switches to connect and disconnect +V and −V to circuit 12.

Figure 7:
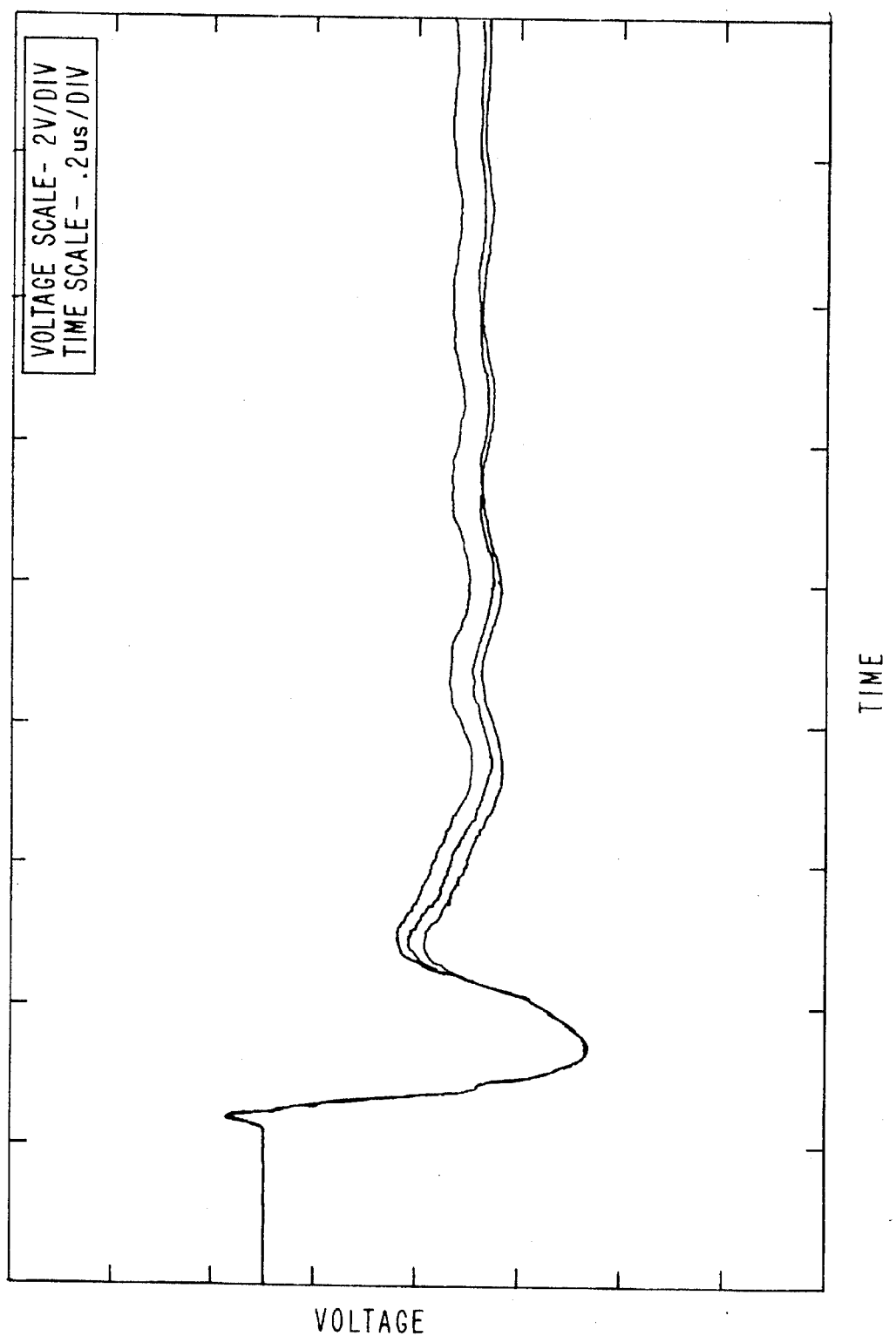
FIG. 7 is a temporal diagram showing $i_{DD}$ pulse responses for three operational amplifiers.
Figure 8:
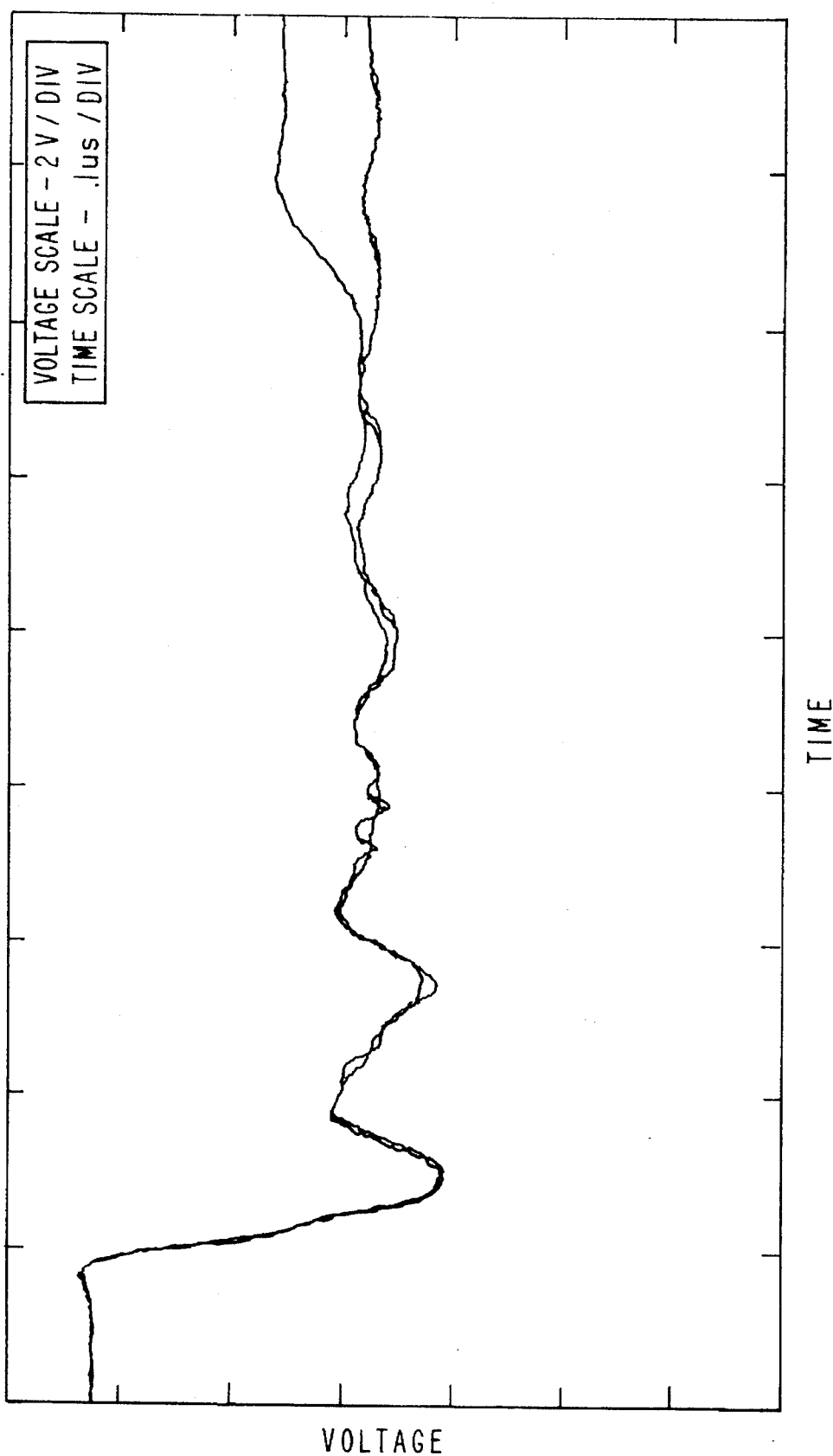
FIG. 8 is a temporal diagram showing $i_{DD}$ pulse responses for three inverters.
Figure 9:
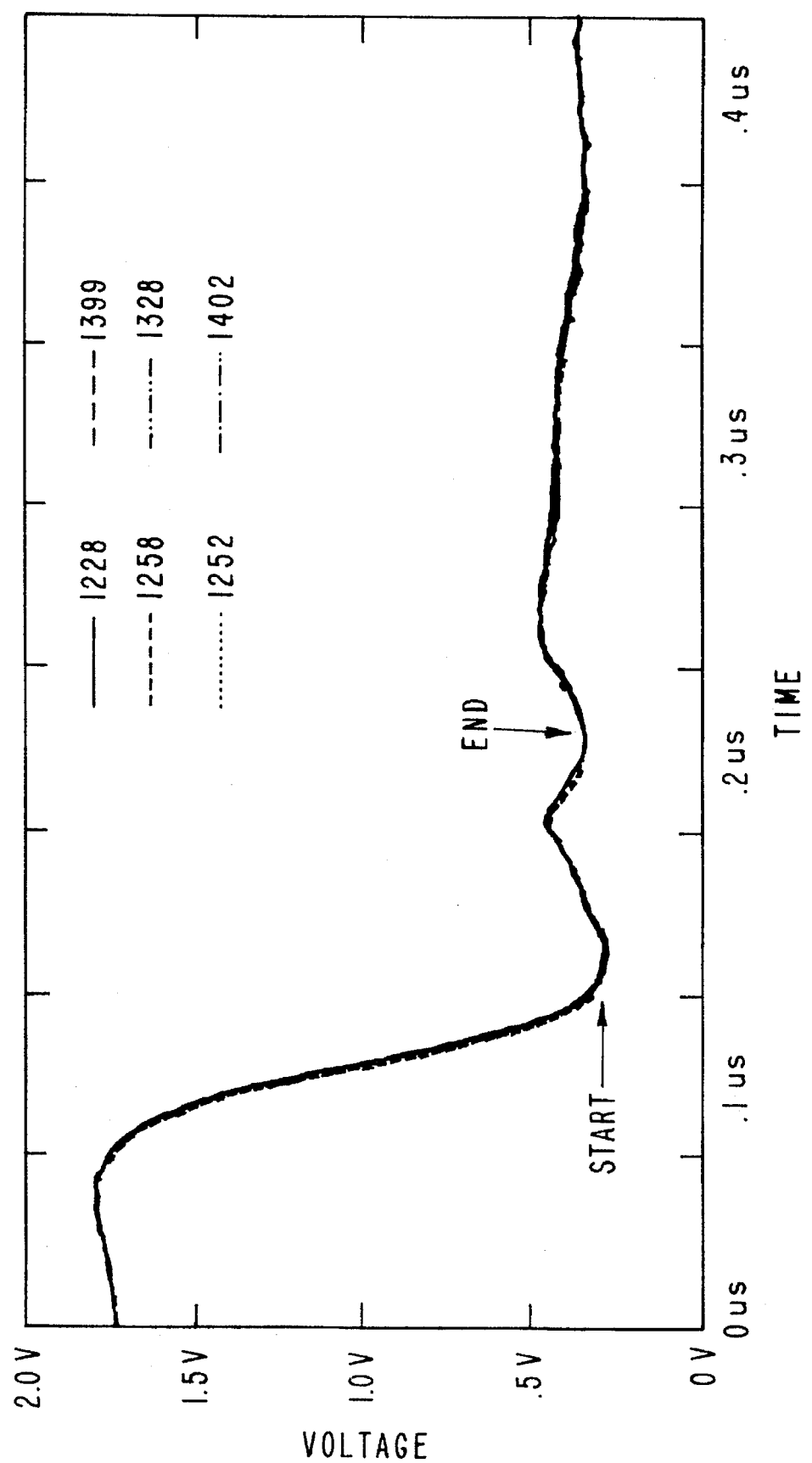
FIG. 9 is a temporal diagram showing $i_{DD}$ pulse responses for six timing control units.

Current mirror 28 monitors transient (instantaneous) current drawn by circuit 12 during the active portion of the test. The output 30 of current mirror 28 also performs a current to voltage transformation (as depicted in FIGS. 7, 8 and 9).

Industrial Applicability

The invention is further illustrated by the following nonlimiting examples. In accordance with the preferred method of the invention, temporal and spectral analysis of pre-tested integrated circuits was obtained by pulsing $V_{DD}$ and $V_{SS}$ supply rails with fast pulses having rapid rise and fall times. Both computer simulations and hardware tests were conducted to analyze and extract important features present in the spectral and temporal characteristics of the $i_{DD}$ signal.

Example 1

Figure 1:
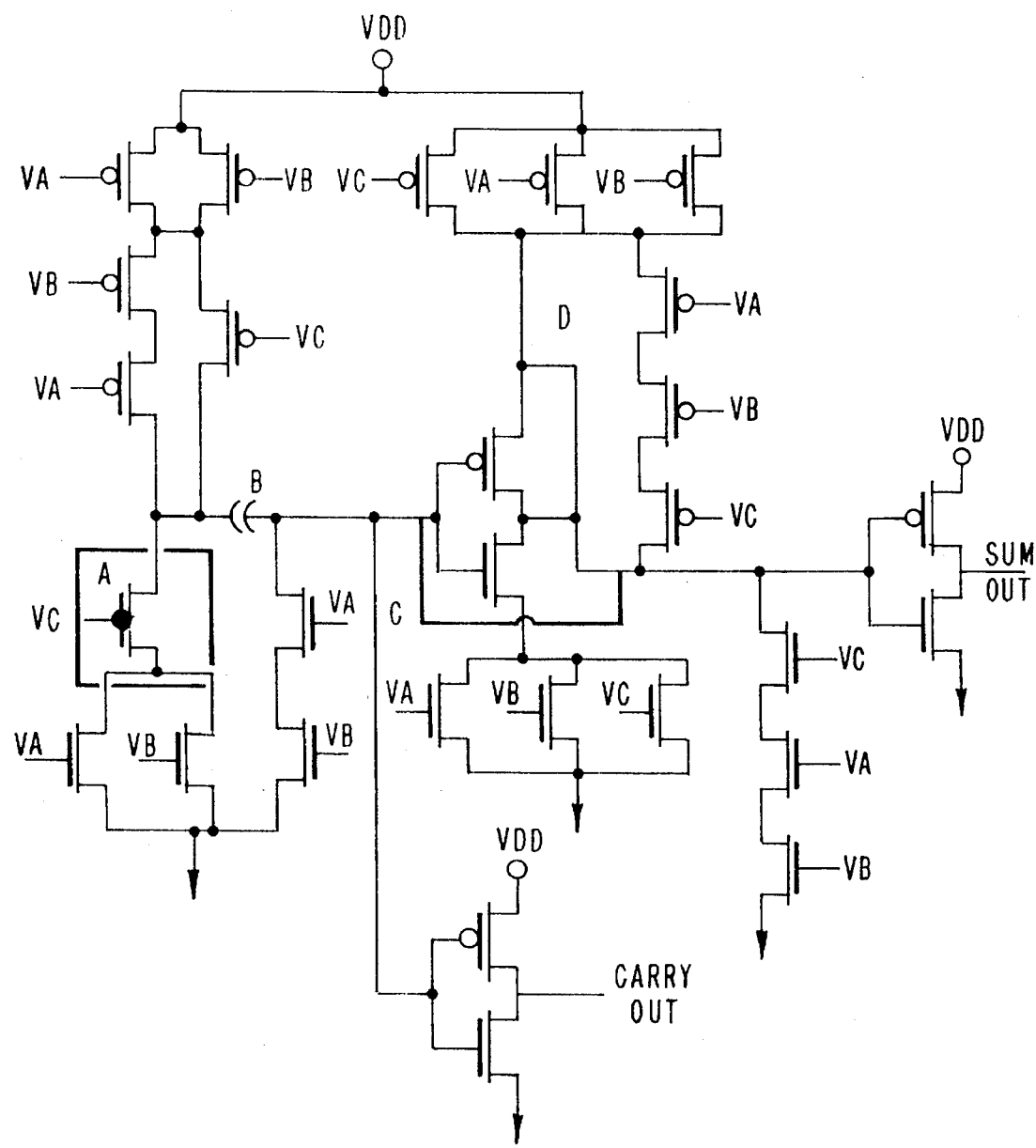
FIG. 1 is a schematic diagram of a digital full adder circuit.

With reference to FIG. 1, a sample full adder IC circuit tested by the preferred method of the invention is therein depicted. The width/length dimensions in μm were 30/2 for all p-channel transistors and 12/2 for all n-channel transistors. Defect locations are specified by notation as follows: (A) gate-oxide shorts, (B) open, (C) poly bridge short and (D) metal bridge shorts.

The power supply rails were pulsed from 2.5 V to the respective rail values (5.0 V; 0.0 V) using a fast 10 ns pulse. Rise and fall times were 3 ns. In actual practice a slower pulse may be required due to external capacitances.

Figure 2:
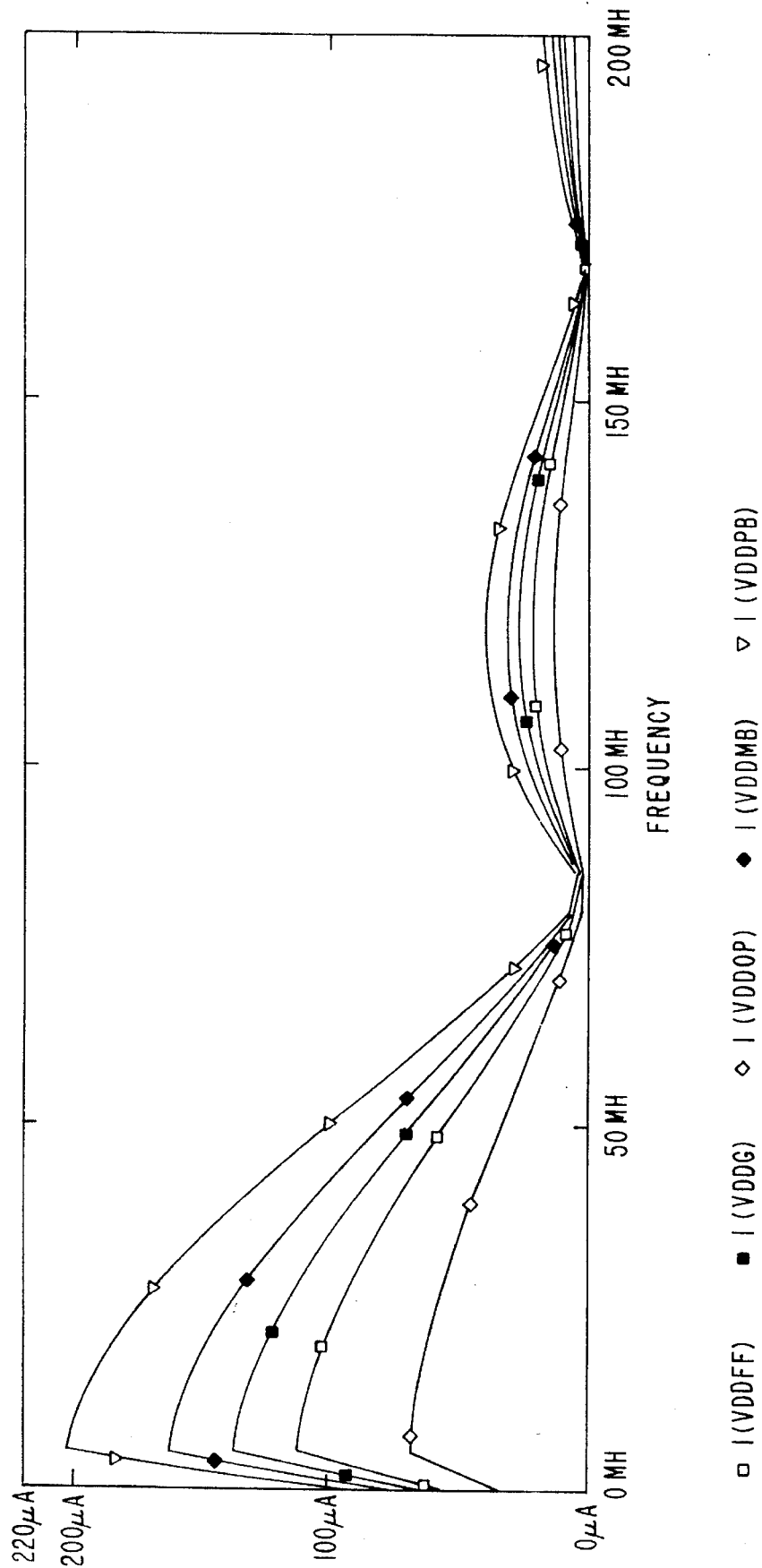
FIG. 2 is a spectral diagram of $i_{DD}$ pulse response for the FIG. 1 circuit.

FIG. 2 illustrates the spectrum of $i_{DD}$ pulse response for the adder circuit of FIG. 1. The notation for the power rails is as follows: VDDFF=defect-free; VDDG=gate-oxide short; VDDOP=open; VDDPB=poly bridge; and VDDMB=metal bridge. FIG. 2 indicates that the spectral energy of the defective circuit does indeed differ from a defect-free circuit. However, the differences between the $i_{DD}$ transient responses of the defective and defect-free circuits are not so readily apparent.

Figure 3:
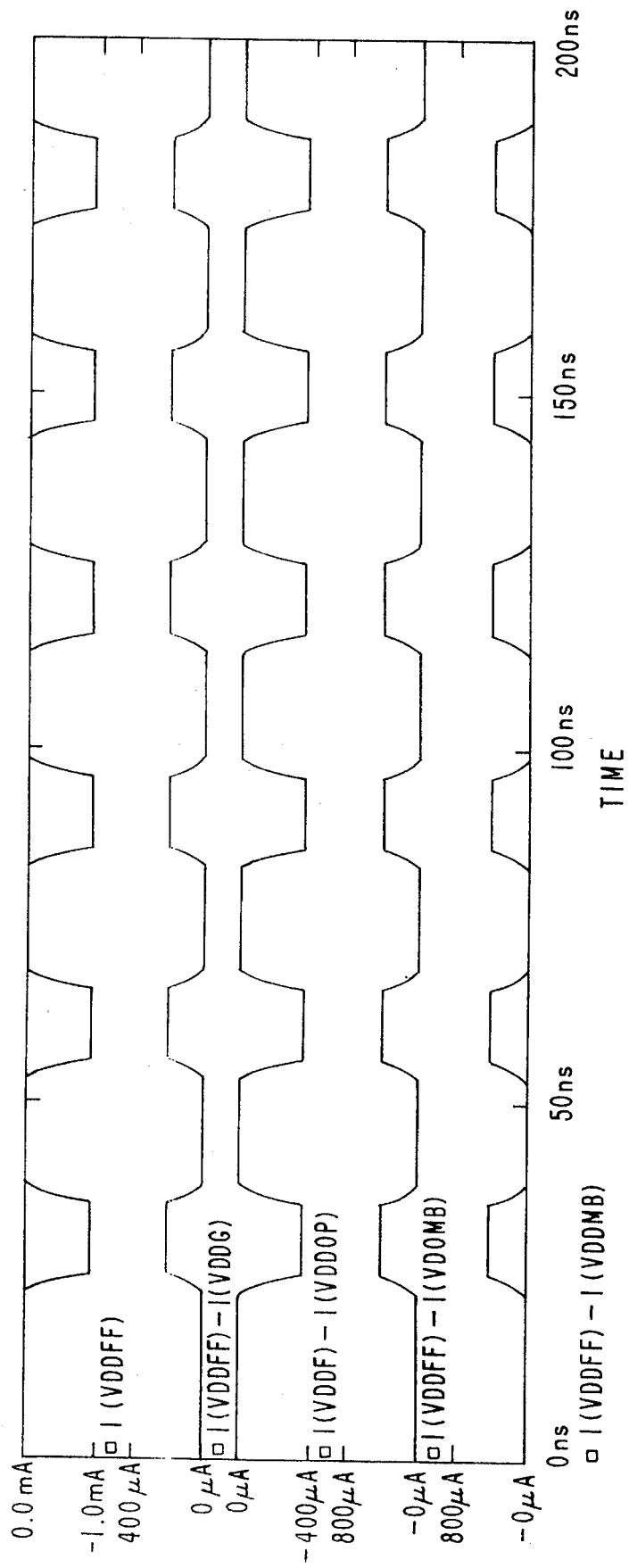
FIG. 3 is a temporal diagram of $i_{DD}$ pulse responses comparing fault-free and fault condition differences for the FIG. 1 circuit.

FIG. 3 is a temporal graph showing the error signal produced by comparing the differences between the defect-free and the defective signals. The results of these subtractions are significant.

While these tests were the result of computer simulations and hardware tests, in practice, in a production line environment, the fault free "reference" signal can be obtained either from computer simulations or, preferably, from a fault free "reference chip."

Example 2

Figure 4A:
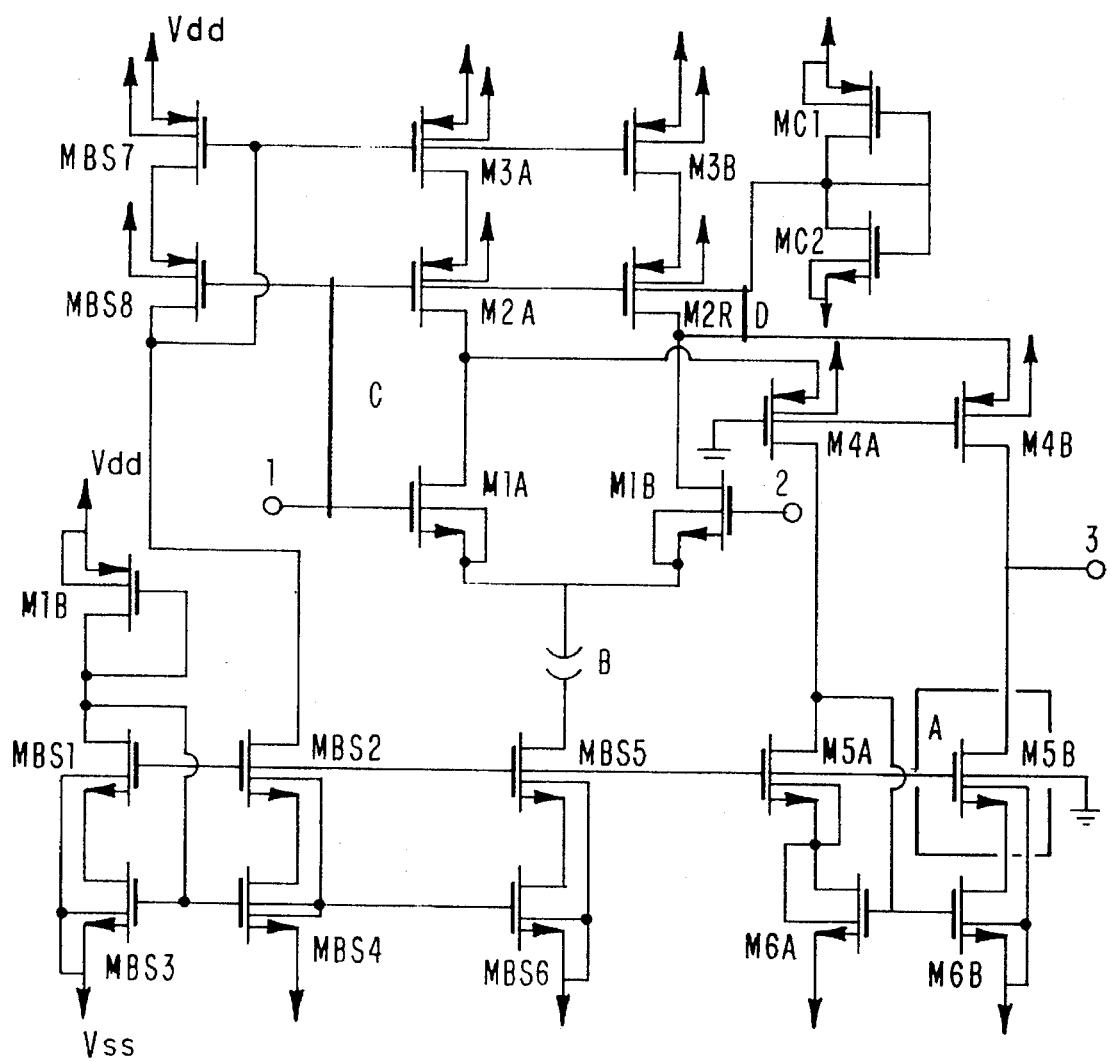
FIGS. 4A and 4B are schematic diagram of an analog folded cascode operational amplifier.
Figure 4B:
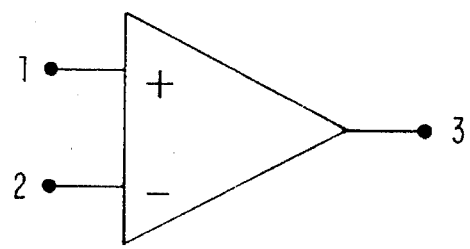

Testing of the preferred method of the invention on analog integrated circuits was performed on a folded cascode operational amplifier connected in voltage follower configuration, depicted in FIG. 4. The same notation is employed. The single input terminal (the non-inverting operational amplifier input) was connected to a DC voltage of 0.0 V, the supply midpoint. The output and the negative input were connected together. Width/length in μm was 60/3 for all p-channel transistors and 30/3 for all n-channel transistors (except M1A, M1B, MC1 with width/length=15/3 and MC2 with width/length=3/3).

Figure 6:
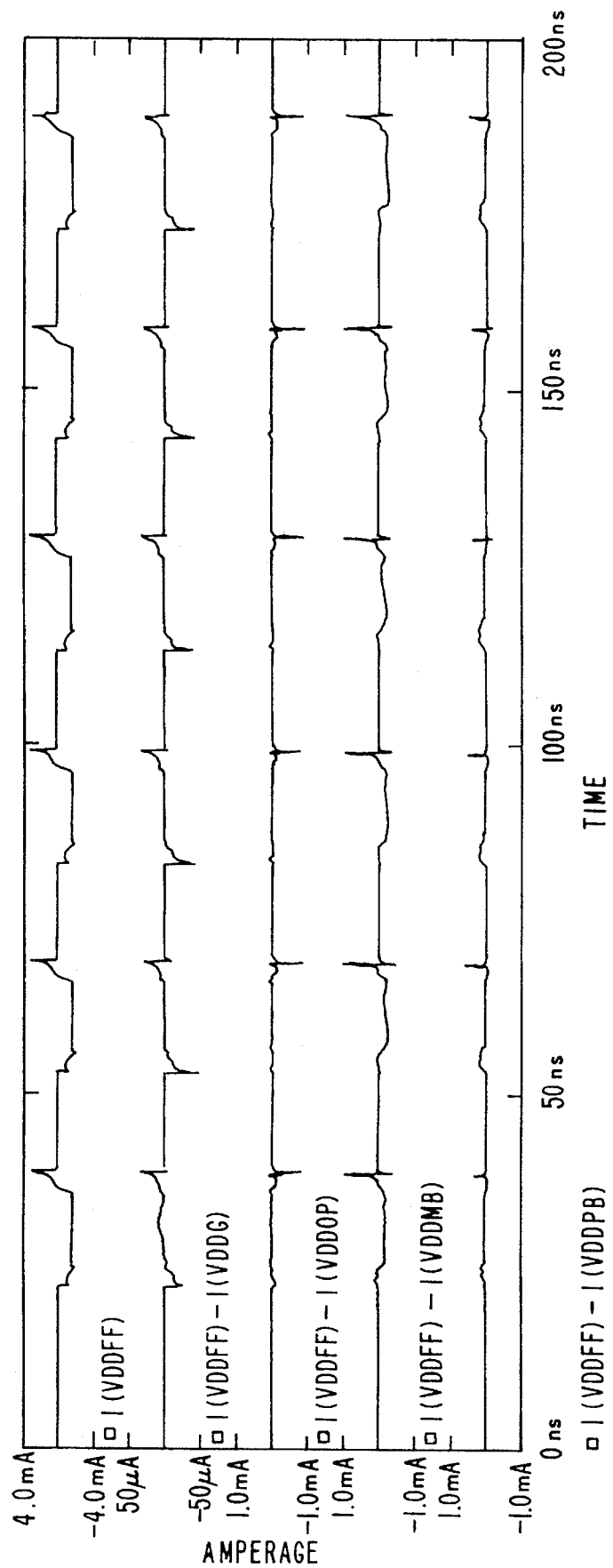
FIG. 6 is a temporal diagram of $i_{DD}$ pulse responses comparing fault-free and fault condition differences for the FIG. 4 circuit.

Computer simulation of the $i_{DD}$ spectrum is shown in FIG. 5. Again, the power supply rails were pulsed from 0.0 V to the respective rail value (5.0 V and −5.0 V, respectively) using a fast 10 ns pulse with a 3 ns rise and fall time. FIG. 6 is a temporal graph showing the resultant computed error signals.

Hardware Tests

The preferred method of the invention was verified by testing sets of integrated circuits. Two of the sets were CMOS digital devices and one set was a bipolar analog device. The devices were tested by setting the input bias voltage at the midpoint of the $V_{DD}$ and $V_{SS}$ power supplies (2.5 V for the digital devices and 0.0 V for the analog devices). $V_{DD}$ and $V_{SS}$ rail voltages were then pulsed to the respective values (5.0 V and 0.0 V for the digital devices and ±5.0 V for the analog devices). The rise and fall times for the devices were approximately 0.3 μs and the pulse rate was 10 μs. A simple current mirror detected the transient current ($i_{DD}$) while performing a current-to-voltage transformation, and a probe from a Tektronix Model 2221A 100 Mhz Digital Storage Oscilloscope was connected to the output of the current mirror.

Example 3

The analog tests were conducted on LM741 8-pin DIP Operational Amplifiers. 340 devices were measured using conventional measurement techniques. Data on four parameters were collected: 1) Functionality; 2) Input Offset Voltage; 3) Gain-Bandwidth Product (GBP); and 4) Common Mode Rejection Ratio (CMRR). Only one device was found to be non-functional.

The preferred method of the invention ($i_{DD}$ pulse response) was next applied to the LM741's. The input voltages were set to 0.0 volts and the rail voltages were pulsed to ±5.0 V at the above specified rate and rise and fall times.

FIG. 7 illustrates a temporal graph showing $i_{DD}$ pulse response measurements obtained for three LM741 devices: A1, B7, and A13. These test results closely track the measured Gain-Bandwidth Product (GBP) as shown below in Table 1.

TABLE 1

| Gain Bandwidth Product Measurements | |
| --- | --- |
| Device | Gain Bandwidth Product |
| A1 | 979 khz |
| B7 | 1164.2 khz |
| A13 | 1440 khz |

Random samples from the 340 devices indicated that $i_{DD}$ pulse response test results were consistent with measured data for the Gain-Bandwidth Product.

Example 4

Tests on digital integrated circuits were conducted on two different architectures: 74HCO4 CMOS Hex-inverter 14-pin DIP packages, and 6 devices functionally equivalent to National Semiconductor NS32C201 Timing Control Unit 24-pin devices which contain approximately 3000 transistors.

The 74HCO4 devices were checked for functionality prior to applying the $i_{DD}$ pulse response method of the invention. Only one device was found to be non-functional. Input voltages were set to 2.5 V and rail voltages were pulsed to +5.0 V and 0.0 at the above specified rate and rise and fall times. FIG. 8 clearly shows which one of three 74HCO4 devices tested by the method of the invention is non-functional.

Example 5

Six timing control unit devices were tested. Previous testing had determined that four of the six devices contained gate-oxide shorts. Table 2 provides a summary of the six devices tested.

TABLE 2

| Timing Control Unit IC's | |
| --- | --- |
| Device number | Description |
| 1228 | Passed gate-oxide (gox) test |
| 1258 | Passed gox test |
| 1252 | Failed gox test - 1 mA defect |

TABLE 2-continued

| Timing Control Unit IC's | |
| --- | --- |
| Device number | Description |
| 1399 | Failed gox test - 4 mA defect |
| 1328 | Failed gox test - 250 uA defect |
| 1402 | Failed gox test - 250 uA defect |

The devices were then tested using the preferred $i_{DD}$ pulse response test method of the invention. The inputs to the device were set to 2.5 V. The $V_{DD}$ and $V_{SS}$ rails were pulsed from the 2.5 V bias to +5.0 V and 0.0 V at a 10 μs pulse rate and approximately 0.3 μs rise and fall times.

FIG. 9 shows a temporal plot of the responses for the six devices. Very little difference is noted between defect-free and defective devices.

To further analyze the data, a PC and back-propagation neural network algorithm were utilized. The data analyzed was limited to the region shown in FIG. 9 beginning at START and terminating at END. This portion of the waveform comprises 46 samples.

Figure 10:
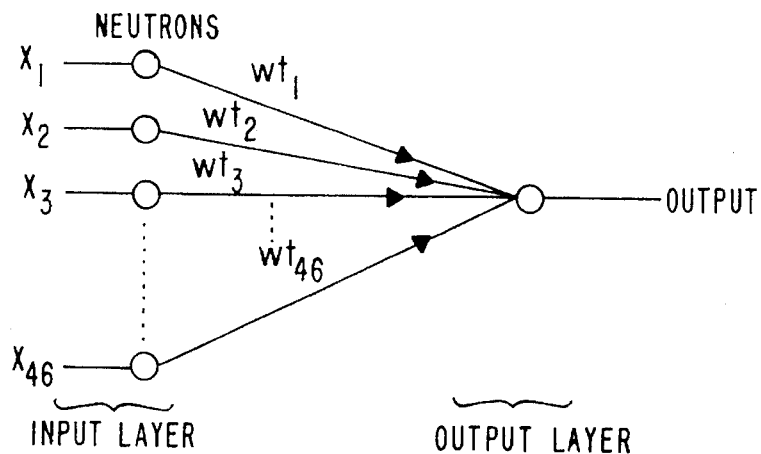
FIG. 10 is a block diagram of the preferred neural network of the invention.

The back-propagation algorithm minimizes mean-square-error between the actual output and desired output. The network is trained by initializing the weights (wt#) to random values. A set of unique patterns ($x_1 \ldots x_{46}$, FIG. 10) and an expected output (Table 3) for each training pattern is input to the network. Weights are adjusted after each pass until desired output and actual output values for the training pattern meet a desired accuracy. As shown in FIG. 10, a simple two-layer neural network was used for analyzing the data.

The back-propagation algorithm and the training patterns were compiled using two defect-free IC's (1228 and 1258) and the gate-oxide defective IC-1252. These IC's were selected so that the neural network could be trained to distinguish a defect-free condition from a defective or irregular state. The weights provide a specific numerical response for a given input. In this example, the back propagation neural network was trained to provide a response of 0.5 for defect-free circuits (1228 and 1258) and a 0.3 for the gate-oxide defect provided by 1252. The network was trained for an accuracy of 1%. Results are shown in Table 3.

TABLE 3

| Results of the Neural Network Training | | |
| --- | --- | --- |
| Device # | Expected Response | Trained Response |
| 1228* | .5 | .498386 |
| 1258* | .5 | .496481 |
| 1252* | .3 | .305505 |
| 1399 | undefined | .264712 |
| 1328 | undefined | .400689 |
| 1402 | undefined | .364548 |

* These devices were part of the training phase.

The neural network provided the correct responses for each circuit. Three groupings are provided in the response: 1) defect-free, 0.498386 and 0.496481; 2) heavy gate-oxide defects, 0.305505 and 0.264712; and 3) light gate-oxide defects, 0.400689 and 0.364548. The defect-free responses were expected since they were part of the training phase; but devices 1399, 1328 and 1402 provided responses consistent with prior defect testing without requiring any training.

The use of biologically motivated neural network systems provides transportability of intelligence as well as enabling predictability of failures Interestingly a simple audio amplifier connected to the output of the preferred test apparatus disclosed herein enables human aural detection of circuit faults "noise" recognition alone, particularly in small circuits. Of course, in the mass production of integrated circuits, automated fault detection is preferred over purely human systems.

The preceding examples can be repeated with similar success by substituting the generically or specifically described components and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, patents, and publications cited above, are hereby incorporated by reference.

What is claimed is:

1. A method of detecting faults in an integrated circuit, the method comprising the steps of:
   a) applying a preselected common fixed DC bias voltage to selected integrated circuit inputs;
   b) pulsing the voltage supply rails of the integrated circuit between a preselected minimum and maximum voltage; and
   c) analyzing an instantaneous rail current generated by pulsing the voltage supply rails and thereby determining whether defects exist in the integrated circuit.

2. The method of claim 1 wherein the step of applying a preselected common fixed DC bias voltage further comprises the step of applying a common fixed DC bias voltage to all of the integrated circuit inputs.

3. The method of claim 1 wherein the step of pulsing the voltage supply rails comprises the step of pulsing the voltage supply rails at a selected pulse rate.

4. The method of claim 1 wherein the step of pulsing the voltage supply rails comprises the step of pulsing the voltage supply rails with pulses having a designated rise and fall time.

5. The method of claim 1 wherein the step of analyzing the instantaneous rail current comprises the step of spectrally analyzing the instantaneous rail current.

6. The method of claim 1 wherein the step of analyzing the instantaneous rail current comprises the step of temporally analyzing the instantaneous rail current.

7. The method of claim 1 wherein the step of analyzing the instantaneous rail current comprises the step of comparing differences between signals of defect-free and defective circuits.

8. The method of claim 1 wherein the step of analyzing the instantaneous rail current comprises the step of providing the instantaneous rail current to a current mirror.

9. An apparatus for detecting faults in an integrated circuit, the apparatus comprising:
   means for applying a preselected common fixed DC bias voltage to selected integrated circuit inputs;
   means for pulsing the voltage supply rails of the integrated circuit between a preselected minimum and maximum voltage; and
   means for analyzing an instantaneous rail current generated by said means for pulsing the voltage supply rails and thereby determining whether defects exist in the integrated circuit.

10. The invention of claim 9 wherein said means for applying a preselected common fixed DC bias voltage comprises means for applying a common fixed DC bias voltage to all of the integrated circuit inputs.

11. The invention of claim 9 wherein said means for pulsing the voltage supply rails comprises means for pulsing the voltage supply rails at a selected pulse rate.

12. The invention of claim 9 wherein said means for pulsing the voltage supply rails comprises means for pulsing the voltage supply rails with pulses having a designated rise and fall time.

13. The invention of claim 9 wherein said means for analyzing the instantaneous rail current comprises means for spectrally analyzing the instantaneous rail current.

14. The invention of claim 9 wherein said means for analyzing the instantaneous rail current further comprises means for temporally analyzing the instantaneous rail current.

15. The invention of claim 9 wherein said means for analyzing the instantaneous rail current comprises means for comparing the differences between signals of defect-free and defective circuits.

16. The invention of claim 9 wherein said means for analyzing the instantaneous rail current comprises current mirror means.

* * * * *